(12) United States Patent
Ota

(10) Patent No.: US 11,595,604 B2
(45) Date of Patent: Feb. 28, 2023

(54) IMAGE SENSOR AND IMAGING DEVICE INCLUDING A PLURALITY OF SEMICONDUCTOR SUBSTRATES

(71) Applicant: NIKON CORPORATION, Tokyo (JP)

(72) Inventor: Hidefumi Ota, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/146,870

(22) Filed: Jan. 12, 2021

(65) Prior Publication Data

US 2021/0136302 A1 May 6, 2021

Related U.S. Application Data

(63) Continuation of application No. 14/771,123, filed as application No. PCT/JP2014/054865 on Feb. 27, 2014, now Pat. No. 10,924,697.

(30) Foreign Application Priority Data

Feb. 27, 2013 (JP) .................................. 2013-037617

(51) Int. Cl.
*H04N 5/369* (2011.01)
*H01L 27/146* (2006.01)
(Continued)

(52) U.S. Cl.
CPC ..... *H04N 5/36961* (2018.08); *H01L 27/1464* (2013.01); *H01L 27/14621* (2013.01);
(Continued)

(58) Field of Classification Search
CPC ........... H01L 27/14621; H01L 27/1464; H01L 27/14641; H04N 9/04557; H04N 5/36961; H04N 5/379; H04N 5/232122; H04N 5/23212; H04N 5/23293; H04N 5/2352; H04N 5/345; H04N 5/3452; H04N 5/3696
See application file for complete search history.

(56) References Cited

U.S. PATENT DOCUMENTS 6,103,421 A 8/2000 Torata et al.
2005/0231618 A1 10/2005 Sugiyama
(Continued)

FOREIGN PATENT DOCUMENTS

EP 2 106 126 A2 9/2009
JP H6-303379 A 10/1994
(Continued)

OTHER PUBLICATIONS

Jun. 3, 2014 International Search Report issued in International Patent Application No. PCT/JP2014/054865.
(Continued)

Primary Examiner — Antoinette T Spinks
(74) Attorney, Agent, or Firm — Oliff PLC

(57) ABSTRACT

An image sensor includes: a first imaging region that captures an image of light entering through an optical system under a first imaging condition and generates a detection signal to perform focus detection of the optical system; and a second imaging region that captures an image of the light entering through the optical system under a second imaging condition other than the first imaging condition and generates an image signal.

20 Claims, 12 Drawing Sheets

(51) Int. Cl.
  *H04N 5/345* (2011.01)
  *H04N 9/04* (2006.01)
  *H04N 5/232* (2006.01)
  *H04N 5/235* (2006.01)

(52) U.S. Cl.
  CPC ..... *H01L 27/14641* (2013.01); *H04N 5/2352* (2013.01); *H04N 5/23212* (2013.01); *H04N 5/23293* (2013.01); *H04N 5/232122* (2018.08); *H04N 5/345* (2013.01); *H04N 5/3452* (2013.01); *H04N 5/3696* (2013.01); *H04N 5/379* (2018.08); *H04N 9/04557* (2018.08)

(56) References Cited

U.S. PATENT DOCUMENTS

| | | |
|---|---|---|
| 2007/0181687 A1 | 8/2007 | Fukushima et al. |
| 2007/0195182 A1 | 8/2007 | Ito |
| 2009/0096903 A1 | 4/2009 | Kusaka |
| 2009/0147117 A1 | 6/2009 | Suzuki et al. |
| 2009/0278966 A1 | 11/2009 | Kusaka |
| 2009/0289169 A1 | 11/2009 | Yang et al. |
| 2010/0002940 A1 | 1/2010 | Aoki et al. |
| 2010/0276572 A1 | 11/2010 | Iwabuchi et al. |
| 2011/0096212 A1 | 4/2011 | Oikawa |
| 2011/0109781 A1 | 5/2011 | Sato |
| 2011/0221952 A1 | 9/2011 | Hamada et al. |
| 2011/0310279 A1 | 12/2011 | Enge et al. |
| 2012/0057046 A1 | 3/2012 | Tanaka |
| 2012/0120293 A1 | 5/2012 | Mabuchi |
| 2012/0154353 A1 | 6/2012 | Mochizuki et al. |
| 2013/0002936 A1 | 1/2013 | Hirama et al. |
| 2013/0182156 A1 | 7/2013 | Moriya et al. |
| 2013/0214128 A1 | 8/2013 | Yamashita et al. |
| 2013/0222631 A1* | 8/2013 | Iwane ............... H01L 27/14601 348/222.1 |
| 2014/0263964 A1 | 9/2014 | Yang et al. |
| 2015/0077590 A1 | 3/2015 | Kuriyama et al. |
| 2016/0014359 A1 | 1/2016 | Ota |

FOREIGN PATENT DOCUMENTS

| | | |
|---|---|---|
| JP | 2005-295381 A | 10/2005 |
| JP | 2006-049361 A | 2/2006 |
| JP | 2006-109103 A | 4/2006 |
| JP | 2006-303755 A | 11/2006 |
| JP | 2009-049858 A | 3/2009 |
| JP | 2009-89143 A | 4/2009 |
| JP | 2009-094881 A | 4/2009 |
| JP | 2010-016621 A | 1/2010 |
| JP | 2012-060370 A | 3/2012 |
| JP | 2012-104684 A | 5/2012 |
| JP | 2012-175234 A | 9/2012 |
| WO | 2014/133076 A1 | 9/2014 |

OTHER PUBLICATIONS

Nov. 16, 2016 Office Action issued in U.S. Appl. No. 14/771,123.
Schrey, O. et al. "A 1K X 1K High Dynamic Range CMOS Image Sensor With On-Chip Programmable Region-of-Interest Readout". IEEE Journal of Solid-State Circuits. IEEE Service Center. Piscataway, NJ, USA. vol. 37, No. 7, Jul. 1, 2002. pp. 911-915.
Sep. 21, 2016 Search Report issued in European Patent Application No. 14756999.0.
Sep. 20, 2016 Office Action issued in Japanese Patent Application No. 2015-503018.
May 9, 2017 Office Action issued in U.S. Appl. No. 14/771,123.
Nov. 20, 2017 Office Action issued in U.S. Appl. No. 14/771,123.
Nov. 3, 2017 Office Action issued in Chinese Patent Application No. 201480010575.X.
May 10, 2018 Office Action issued in U.S. Appl. No. 14/771,123.
Nov. 27, 2018 Office Action issued in Indian Application No. 7606/DELNP/2015.
Apr. 8, 2019 Office Action issued in U.S. Appl. No. 14/771,123.
Apr. 17, 2019 Office Action issued in European Patent Application No. 14 756 999.0.
Sep. 23, 2019 Office Action issued in U.S. Appl. No. 14/771,123.
Feb. 19, 2020 Office Action issued in European Patent Application No. 14 756 999.0.
May 6, 2020 Office Action issued in U.S. Appl. No. 14/771,123.
Jun. 3, 2020 Office Action issued in Chinese Patent Application No. 201811159203.X.
Sep. 22, 2020 Office Action issued in European Patent Application No. 14 756 999.0.
Oct. 13, 2020 Notice of Allowance issued in U.S. Appl. No. 14/771,123.
Dec. 8, 2020 Office Action issued in Japanese Patent Application No. 2019-185900.
Apr. 13, 2016 Office Action issued in U.S. Appl. No. 14/771,123.
Apr. 20, 2021 Office Action issued in Japanese Patent Application No. 2019-185900.
Jul. 30, 2021 Office Action issued in Chinese Patent Application No. 201811159203.X.
Jul. 19, 2022 Office Action issued in Japanese Patent Application No. 2021-119878.

* cited by examiner

FIG.11

| SETTING | REGION | SPECIFIC EXAMPLE | CLASSIFICATION | CONTENT OF SETTING |
|---|---|---|---|---|
| SETTING 1 | HIGH BRIGHTNESS REGION | SUN, ETC. | HIGH BRIGHTNESS | FRAME RATE, GAIN SUITABLE FOR HIGH BRIGHTNESS USED FOR NEITHER AF NOR AE |
| SETTING 2 | MAIN SUBJECT REGION | HUMAN, ANIMAL | MAIN SUBJECT | FRAME RATE, GAIN SUITABLE FOR EACH AF REGION AND AE REGION |
| SETTING 3 | BACKGROUND REGION | TREES, BUILDINGS | BACKGROUND | FRAME RATE, GAIN SUITABLE FOR AE IN BACKGROUND |

IMAGE SENSOR AND IMAGING DEVICE INCLUDING A PLURALITY OF SEMICONDUCTOR SUBSTRATES

This is a Continuation of application Ser. No. 14/771,123 filed Aug. 27, 2015, which is a National Stage Application of PCT/JP2014/054865 filed Feb. 27, 2014, which in turn claims priority to Japanese Application No. 2013-037617 filed Feb. 27, 2013. The entire disclosures of the prior applications are hereby incorporated by reference herein in their entireties.

TECHNICAL FIELD

The present invention relates to an image sensor and to an electronic device.

BACKGROUND ART

An electronic device equipped with an image sensor that includes a backside illuminated imaging chip and a signal processing chip stacked one on another (hereafter referred to as "stacked image sensor") has been proposed (see PTL 1). A stacked image sensor is constituted by a backside illuminated imaging chip and a signal processing chip stacked one on another so as to be connected to each other through a bump in each predetermined region.

CITATION LIST

Patent Literature

PTL1: JP 2006-49361 A

SUMMARY OF INVENTION

Technical Problem

However, not so many proposals have been made on an electronic device equipped with a conventional stacked image sensor to divide an image into one or more blocks having the above-mentioned region and acquire an image for each block and the usability of the electronic device equipped with such stacked image sensors is not sufficient.

Solution to Problem

According to the 1st aspect of the present invention, an image sensor comprises: a first imaging region that captures an image of light entering through an optical system under a first imaging condition and generates a detection signal to perform focus detection of the optical system; and a second imaging region that captures an image of the light entering through the optical system under a second imaging condition other than the first imaging condition and generates an image signal.

According to the 2nd aspect of the present invention, an image sensor comprises: a first imaging region that captures an image of light entering through an optical system under a first imaging condition and generates a detection signal to perform focus detection of the optical system; and a second imaging region that captures an image of the light entering through the optical system under a second imaging condition other than the first imaging condition and generates a signal for use in exposure calculation.

According to the 3rd aspect of the present invention, an image sensor comprises: a first imaging region that captures an image of light entering through an optical system under a first imaging condition and generates a detection signal to perform focus detection of the optical system; and a second imaging region that captures an image of the light entering through the optical system under a second imaging condition other than the first imaging condition and generates a signal for use in white balance adjustment.

According to the 4th aspect of the present invention, it is preferred that in the image sensor according to any one of the 1st to 3rd aspects, the frame rate set under the first imaging condition is higher than the frame rate set under the second imaging condition.

According to the 5th aspect of the present invention, it is preferred that in the image sensor according to any one of the 1st to 4th aspect, the send imaging region has an area that is larger than an area of the first imaging region.

According to the 6th aspect of the present invention, an electronic apparatus comprises: the image sensor according to any one of the 1st to 5th aspects; and a setting unit that sets a position at which the first imaging region is arranged and a position at which the second imaging region is arranged.

According to the 7th aspect of the present invention, it is preferred that the electronic apparatus according to the 6th aspect further comprises: an analysis unit that analyzes distribution of brightness of a subject, and the setting unit sets the position at which the first imaging region is arranged and the position at which the second imaging region is arranged based on the distribution of brightness analyzed by the analysis unit.

According to the 8th aspect of the present invention, it is preferred that in the electronic apparatus according to the 7th aspect, the setting unit sets the first imaging region and the second imaging region in a region that is determined to contain a main subject based on a result of analysis by the analysis unit.

According to the 9th aspect of the present invention, it is preferred that in the electronic apparatus according to the 8th aspect, the setting unit sets the second imaging region in a region other than the region that is determined to contain a main subject based on the result of analysis by the analysis unit.

According to the 10th aspect of the present invention, it is preferred that in the electronic apparatus according to any one of the 6th to 9th aspects, the setting unit sets the first imaging region and the second imaging region in a region that is determined to have brightness exceeding a predetermined brightness value based on the result of the analysis by the analysis unit.

According to the 11th aspect of the present invention, it is preferred that the electronic apparatus according to any one of the 6th to 10th aspects further comprises: a storage unit that stores an image signal; and an instruction unit that instructs the storage unit to store an image signal, and the setting unit, if instructed by the instruction unit to store the image signal, cancels setting of the first image condition and setting of the second image condition.

Advantageous Effects of Invention

The present invention enables providing an electronic device that is capable of performing a plurality of pretreatments prior to actual imaging with high precision and that has high usability.

BRIEF DESCRIPTION OF DRAWINGS

FIG. 11 is a diagram illustrating three settings to the image sensor; and

DESCRIPTION OF EMBODIMENTS

Hereafter, embodiments according to the present invention are explained with reference to the attached drawings.

First Embodiment

<Explanation of Stacked Image Sensor>

Figure 1:
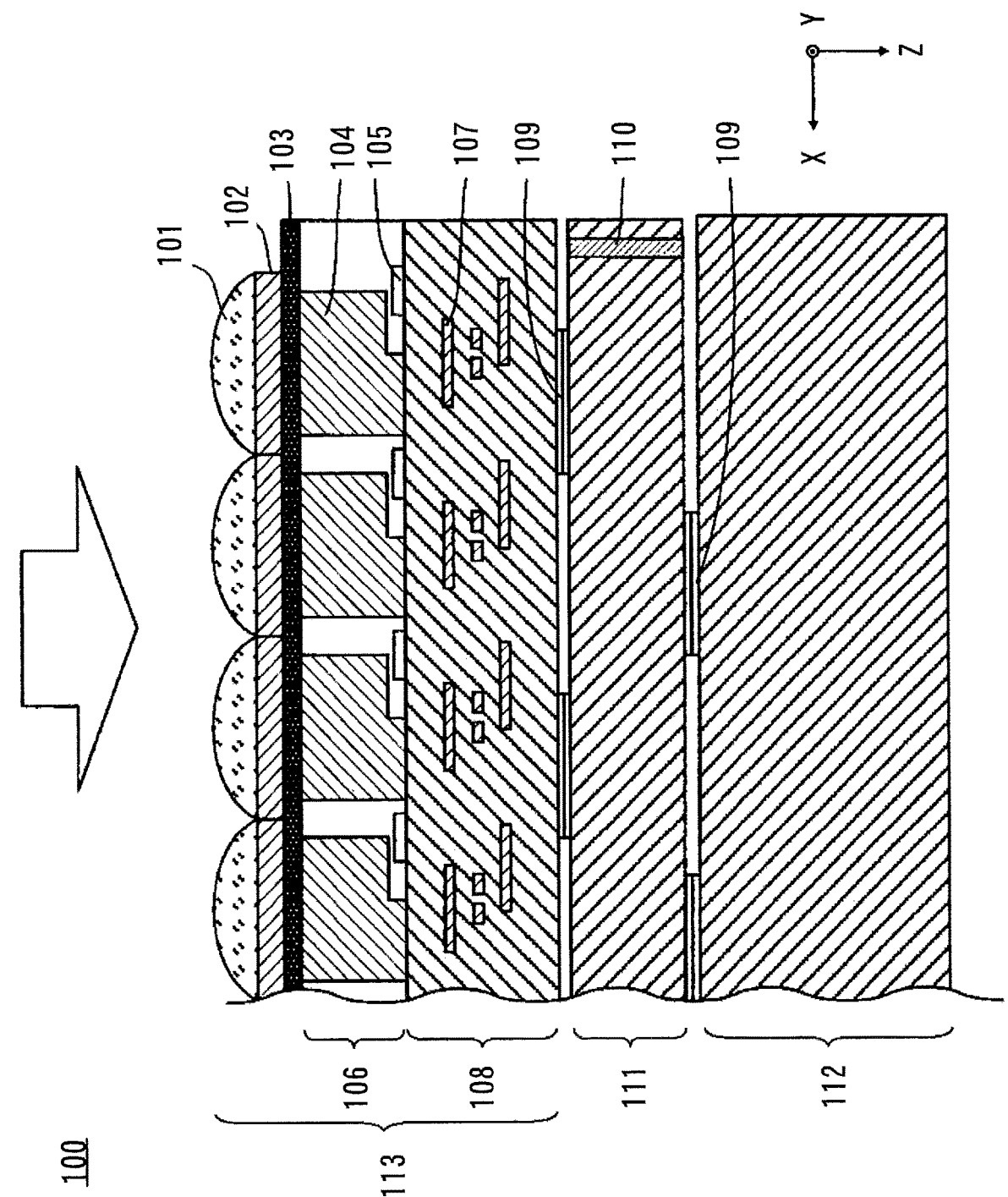
FIG. 1 is a cross-section showing a stacked image sensor.

First, explanation is made of a stacked image sensor 100 installed on an electronic device (for instance, an imaging device 1) according to a first embodiment of the present invention. The stacked image sensor 100 is described in Japanese patent application No. 2012-139026, which is an earlier application filed by the applicant. FIG. 1 is a cross-section illustrating a stacked image sensor 100. The image sensor 100 includes a backside illuminated imaging chip 113 that outputs an image signal corresponding to incident light, a signal processing chip 111 that processes image signals, and a memory chip 112 that stores image signals. The imaging chip 113, the signal processing chip 111, and the memory chip 112 are stacked one on another and electrically connected to each other through a bump 109, which has electroconductivity and is made of, for instance, Cu.

As shown in the drawings, incident light mostly enters in a positive orientation of a Z axis as indicated by a non-filled arrow. In the present embodiment, a surface of the imaging chip 113 where incident light enters is referred to as a backside. It is assumed that as shown in the coordinate axes, a leftward orientation of a line on plane of paper that orthogonally crosses the Z axis is a positive orientation of X axis and a frontward orientation of a line on plane of paper that orthogonally crosses the Z axis and the X axis is a positive orientation of Y axis. In some subsequent figures, coordinate axes are indicated to enable the reader to understand the orientations of the respective figures based on the coordinate axes in FIG. 1 as a standard.

An example of the imaging chip 113 is a backside illuminated metal oxide semiconductor (MOS) image sensor. A photodiode (PD) layer 106 is arranged on the backside of an interconnection layer 108. The PD layer 106, which is arranged two-dimensionally, includes a plurality of photodiodes (PDs) 104 that accumulate charges according to the incident light and transistors 105 provided in correspondence to the PDs 104.

On the incoming side of the incident light at the PD layer 106 are provided color filters 102 via a passivation film 103. The color filters 102 include a plurality of types of color filters 102 that transmit lights with different wavelength regions having specified arrangements in correspondence to the respective PDs 104. The arrangement of the color filters 102 is described later. A set of the color filter 102, the PD 104, and the transistor 105 constitutes a pixel.

On the incoming side of the incident light at the color filter 102 are provided microlenses 101 in correspondence to respective pixels. The microlens 101 collect the incident light and passes the collected light toward the corresponding PDs 104.

The interconnection layer 108 has an interconnection 107 that transfers a pixel signal from the PD layer 106 to the signal processing chip 111. The interconnection 107 may be constituted by multiple layers or may be provided with a passive element and an active element.

On a surface of the interconnection layer 108 are provided with a plurality of bumps 109. The bumps 109 of the interconnection layer 108 are aligned with a plurality of bumps 109 provided at a surface of the signal processing chip 111 facing the interconnection layer 108. The aligned bumps 109 of the interconnection layer 108 and the bumps 109 of the signal processing chip 111 are joined, for instance, by pressing the imaging chip 113 with the signal processing chip 111, to establish electrical connection.

Similarly, on each of the facing surfaces of the signal processing chip 111 and memory chip 112 is provided a plurality of bumps 109. Aligning the bumps 109 on the facing surfaces with each other and, for instance, pressing the signal processing chip 111 with the memory chip 112 causes the aligned bumps 109 on the facing surfaces to be joined and electrically connected.

To join the bumps 109 on the facing surfaces with each other, not only Cu bump joint by solid phase diffusion but also microbump connection by solder fusion may be adopted. The bumps 109 may be provided at intervals of, for instance, about one for each unit region, which is described later. Accordingly, the size of each bump 109 may be larger than a pitch at which the PDs 104 are arranged. In a peripheral region other than a pixel region where pixels are arranged, a bump larger than the bump 109 that corresponds to the pixel region may be provided in addition.

The signal processing chip 111 has a through silicon via (TSV) 110 that connects circuits provided on front and back sides, respectively, with each other. Preferably, the TSV 110 is provided in the peripheral region. The TSV 110 may be provided at the peripheral region of the imaging chip 113 and also at the memory chip 112.

Figure 2:
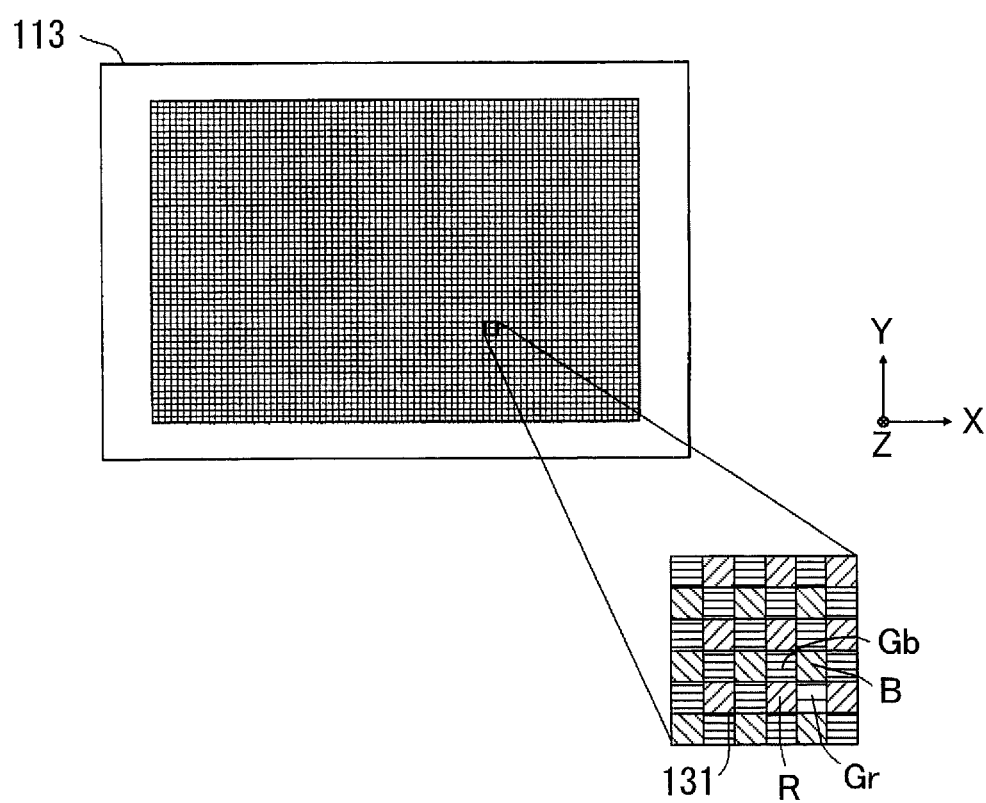
FIG. 2 is a diagram illustrating the arrangement of pixels and unit region of an imaging chip.

FIG. 2 is a diagram illustrating the arrangement of pixels and unit regions 131 at the imaging chip 113. Particularly, FIG. 2 shows an appearance of the imaging chip 113 as seen from the backside. In the pixel region, for instance, 20,000,000 or more pixels are arranged in a matrix. In the present embodiment, for instance, adjacent 4 pixels×4 pixels, i.e., 16 pixels form one unit region 131. Grid lines in FIG. 2 illustrate a concept that adjacent pixels are grouped to form one unit region 131. The number of pixels forming each the unit region 131 is not limited to 16, but may be about 1,000, for instance, 32 pixels×64 pixels, or more or smaller than this (for instance 1 pixel).

As shown in a partial enlarged diagram of the pixel region, each unit region 131 includes four so-called Bayer arrangements arranged up, down, left and right, each consisting of four pixels, i.e., green pixels Gb, Gr, blue pixel B, and red pixel R. The green pixels are pixels having a green filter as the color filter 102, receiving light in green light wavelength range out of the incident light. Similarly, the blue pixel is a pixel having a blue filter as the color filter 102, receiving light in a blue wavelength range whereas the red pixel is a pixel that has a red filter as the color filter 102, receiving light in a red wavelength range.

In the present embodiment, a plurality of blocks is defined such that each block contains at least one unit region 131. In each blocks, the pixels contained in respective blocks are controlled by control parameters different from each other. That is, image signals under different imaging conditions may be obtained from the pixel group in one block and the pixel group in another block. Examples of the control parameter includes frame rate, gain, subsampling or culling rate, number of addition rows or number of addition columns in which pixel signal is to be added, time length or number of times in which charge is accumulated, and bit number in digitization and so on. Further, the control parameters may be parameters that are used in image processing after the image signal is acquired from the pixel.

Figure 3:
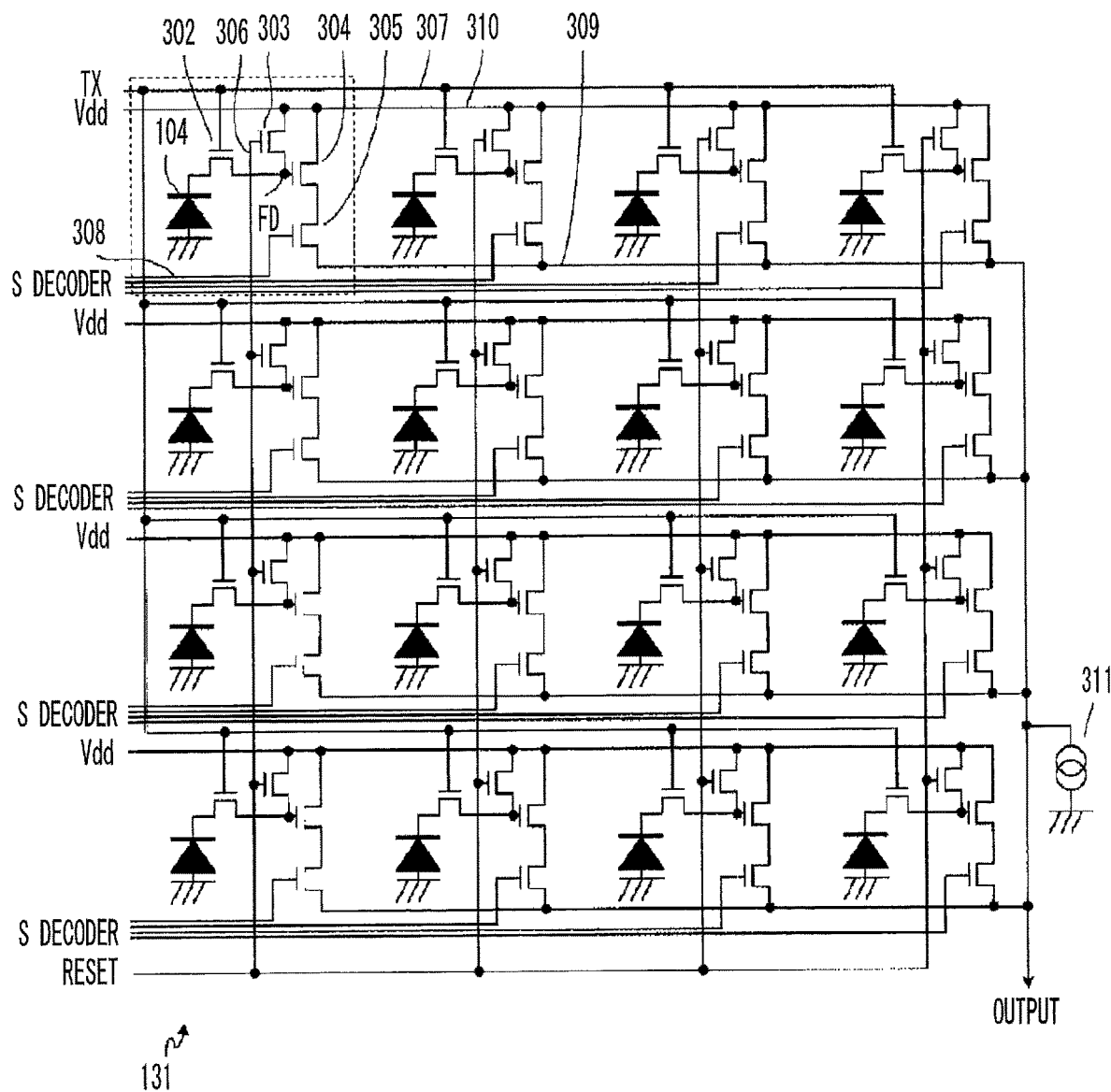
FIG. 3 is a circuit diagram corresponding to a unit region of the imaging chip.

FIG. 3 is a circuit diagram corresponding to the unit region 131 of the imaging chip 113. In FIG. 3, a rectangle, which is circled in dotted line as a representative, indicates a circuit corresponding to one pixel. At least a portion of the transistors described below corresponds to the transistor 105 shown in FIG. 1.

As described above, one unit region 131 is formed by 16 pixels. Sixteen PDs 104 corresponding to the respective pixels are each connected to a transfer transistor 302. The gate of each transfer transistor 302 is connected to a TX interconnection 307, to which transfer pulses are supplied. In the present embodiment, one TX interconnection 307 is connected to the 16 transfer transistors 302 in common.

The drain of each transfer transistor 302 is connected to the source of each corresponding reset transistor 303. In addition, a so-called floating diffusion FD between the drain of the transfer transistor 302 and the source of the reset transistor 303 is connected to the gate of an amplifying transistor 304. The drain of the reset transistor 303 is connected to a Vdd interconnection 310, which supplied with power-supply voltage, and the gate of the reset transistor 303 is connected to the reset interconnection 306, to which is supplied a reset pulse. In the present embodiment, one reset interconnection 306 is connected to the 16 reset transistors 303 in common.

The drain of each amplifying transistor 304 is connected to a Vdd interconnection 310, to which is supplied power-supply voltage. The source of each amplifying transistor 304 is connected to the drain of each corresponding transistor 305. Each gate of the selection transistors is connected to a decoder interconnection 308, to which a selection pulse is supplied. In the present embodiment, the decoder interconnection 308 is provided to each of the 16 selection transistors 305 independently. The source of each selection transistor 305 is connected to a common output interconnection 309. A load current source 311 supplies current to the output interconnection 309. That is, the output interconnection 309 for the selection transistor 305 is formed by a source follower. The load current source 311 may be provided at the imaging chip 113 or at the signal processing chip 111.

Now, explanation is made on the flow of operations from the start of accumulation of charge to output from the pixels after completion of the accumulation of charge. When a reset pulse is applied to the reset transistor 303 via the reset interconnection 306 and at the same time a transfer pulse is applied to the transfer transistor 302 via the TX interconnection 307, the electric potentials of the PD 104 and of the floating diffusion FD are reset.

When the application of transfer pulse is stopped, the PD 104 converts the received incident light into charge and accumulates the resultant charge. Then, a transfer pulse is applied again in a state where no reset pulse is applied, the accumulated charge is transferred to the floating diffusion FD. This changes the electric potential of the flowing diffusion FD from the reset potential to a signal potential after the accumulation of charge. When a selection pulse is applied to the selection transistor 305 via the decoder interconnection 308, a variation in the signal potential of the floating diffusion FD is transferred to the output interconnection 309 via the amplifying transistor 304 and the selection transistor 305. This causes respective pixel signals corresponding to the reset potential and the signal potential to be output from the unit pixels to the output interconnection 309.

As shown in FIG. 3, for the 16 pixels that constitute on unit region 131, one reset interconnection 306 and one TX interconnection 307 are provided in common. That is, the reset pulse and the transfer pulse are each applied to all the 16 pixels at the same time. Therefore, all the pixels that form one unit region 131 start the accumulation of charges at the same timing and complete the accumulation of charges at the same timing. The pixel signals corresponding to the accumulated charges are selectively output from the output interconnection 309 by sequentially applying selection pulses to the selection transistors 305, respectively. The reset interconnection 306, the TX interconnection 307, and the output interconnection 309 are provided at each unit region 131 separately.

Arranging circuits on the basis of the unit region 131 enables control of time of charge accumulation for each unit region 131. In other words, it is possible to cause the pixel signals to be output at different frame rates from different unit regions 131. Furthermore, while the accumulation of charge in one unit region 131 is being performed once, the accumulation of charge in another unit region 131 may be performed in a plurality of times repeatedly to output a pixel signal for each time. This enables these unit regions 131 to output frames for a movie at different frame rates.

Figure 4:
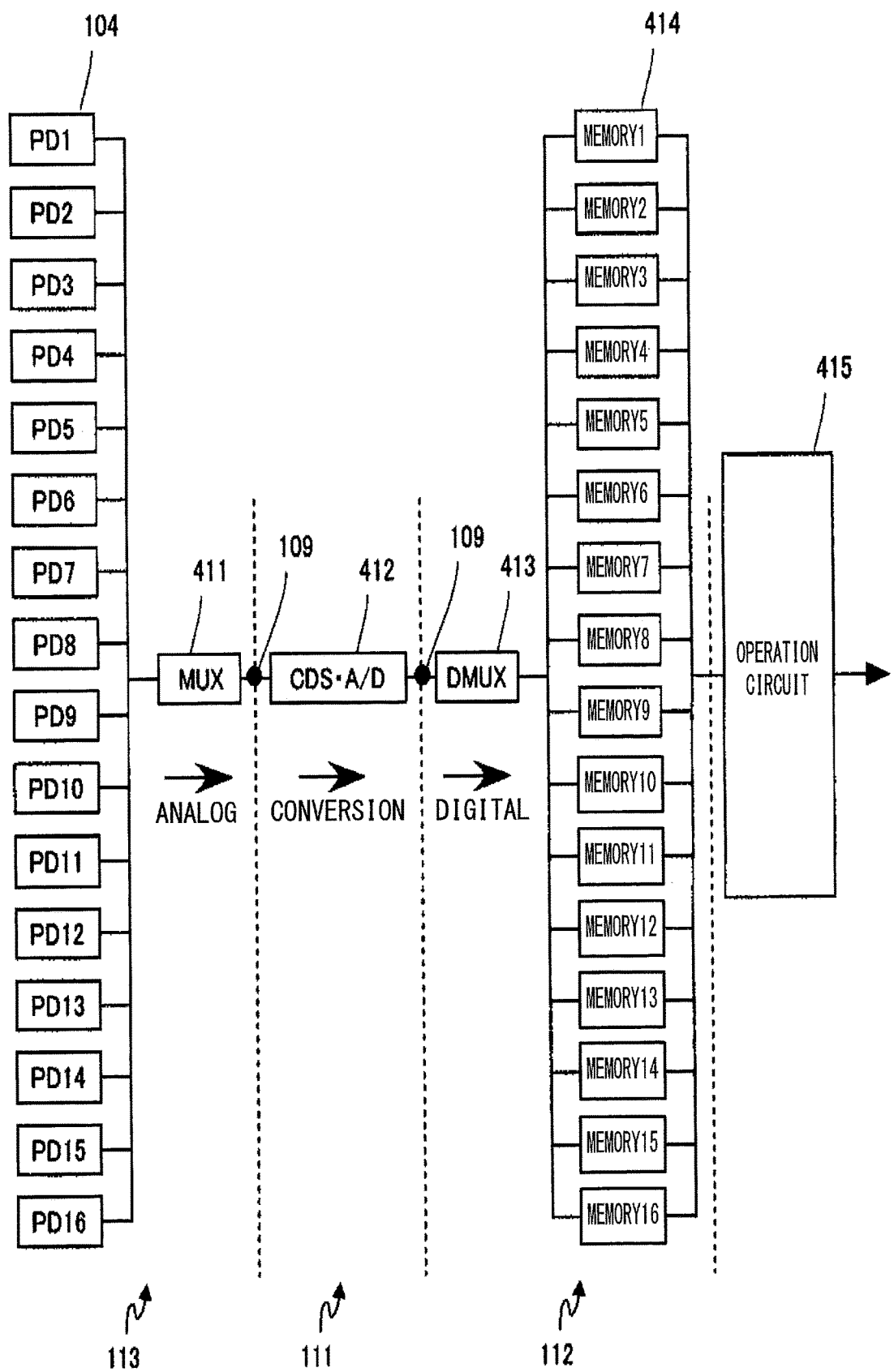
FIG. 4 is a block diagram showing the functional configuration of the image sensor.

FIG. 4 is a block diagram illustrating the functional configuration of the image sensor 100. An analog multiplexer 411 sequentially selects sixteen PDs 104 that form a specified unit region 131 and outputs respective pixel signals to the output interconnection 309 provided in correspondence to the specified unit region 131. The multiplexer 411 together with the PD 104 is formed at the imaging chip 113.

The image signal output via the multiplexer 411 is processed by a signal processing circuit 412, which is provided at the signal processing chip 111 and performs correlated double sampling (CDS) analog/digital (A/D) conversion, to perform CDS and A/D conversion. The pixel signals subjected to the A/D conversion are passed over to a demultiplexer 413 and stored at pixel memories 414 that correspond to the respective pixels. The demultiplexer 413 and the pixel memories 414 are formed at the memory chip 112.

The operation circuit 415 processes the pixel signal stored at the pixel memory 414 and passes the processed signal to a subsequent image processing unit. The operation circuit 415 may be provided at the signal processing chip 111 or at the memory chip 112. FIG. 4 shows connections for a single unit region 131. Actually, such connections are provided for each unit region 131 to enable parallel operations. The operation circuits 41 need not be provided for each unit region 131. For instance, one operation circuit 415 may perform sequential operation by referring to values stored at the pixel memories 414 corresponding to the respective unit regions 131.

As mentioned above, output interconnections 309 are provided in correspondence to the unit regions 131, respectively. The image sensor 100 includes the imaging chip 113, the signal processing chip 111, and the memory chip 112 stacked one on another. Consequently, use of electrical connection between the chips with bump 109 as the output interconnection 309 allows arranging the interconnections without an increase in size of each chip in the planar direction.

<Explanation of Imaging Device>

Figure 5:
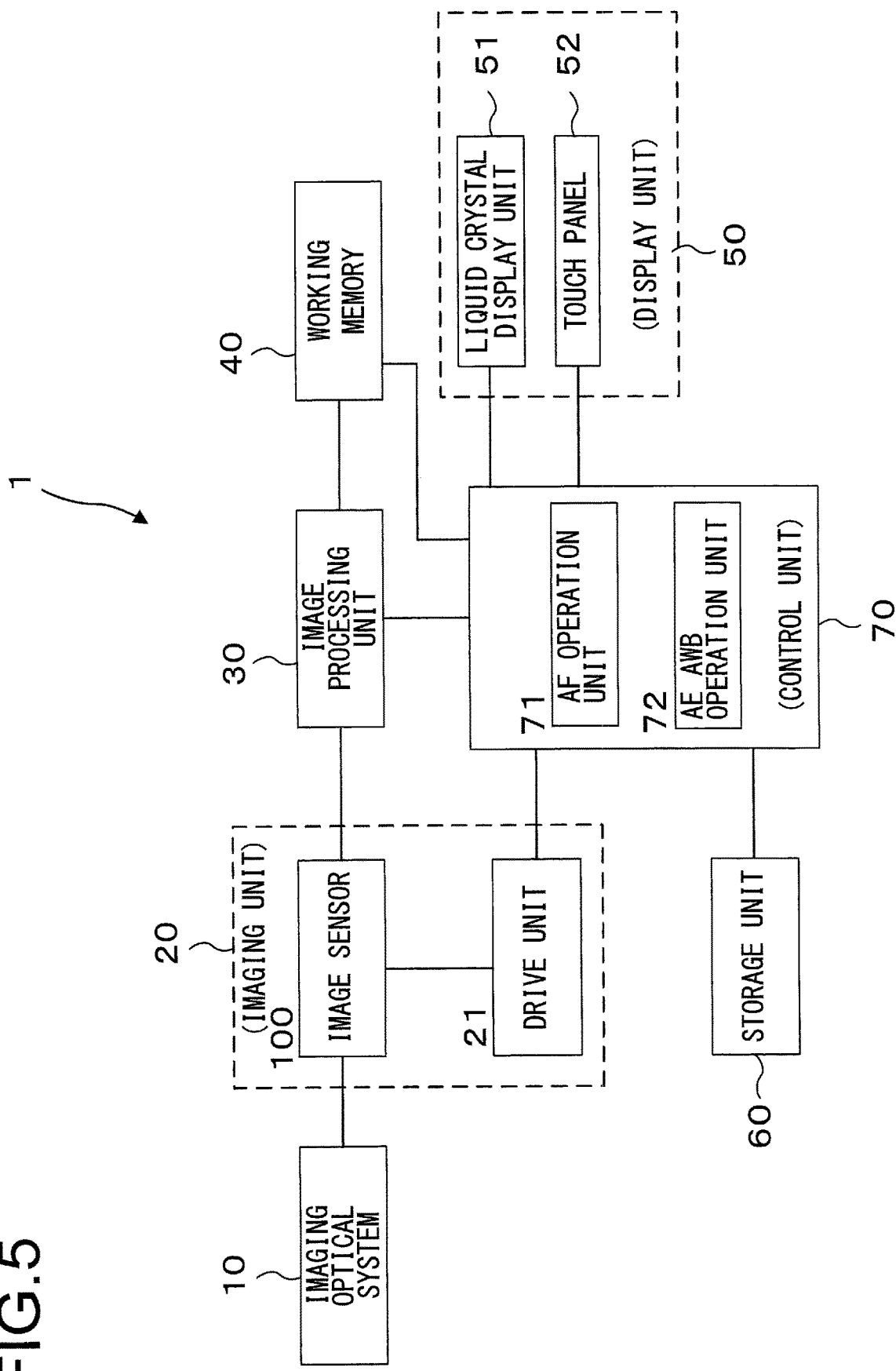
FIG. 5 is a block diagram illustrating an example of the configuration of the image sensor.

FIG. 5 is a block diagram showing the arrangement of the imaging device 1 having the above-mentioned image sensor 100 taken as an example. In FIG. 5, the imaging device 1 includes an imaging optical system 10, an imaging unit 20, an image processing unit 30, a working memory 40, a display unit 50, a storage unit 60, and a control unit 70.

The imaging optical system 10 includes a plurality of lenses and conducts light flux from the field to the imaging unit 20. The imaging optical system 10 may be arranged integrally with the imaging device 1 or interchangeable with the imaging device 1. The imaging optical system 10 may include a built-in focus lens or a built-in zoom lens.

The imaging unit 20 includes the above-mentioned image sensor 100 and a drive unit 21 that drives the image sensor 100. The image sensor 100 is controlled for its drive with a control signal output from the drive unit 21 to enable independent control of accumulation of charge on the basis of block as mentioned above. The control unit 70 sends instructions with respect to the position, shape, and range of the above-mentioned blocks to the drive unit 21.

The image processing unit 30 in cooperation with the working memory 40 performs image processing on the image data acquired by the imaging unit 20. In the present embodiment, the image processing unit 30 performs ordinary image processing (including color signal processing, gamma correction, etc.) and in addition detection processing for detecting a main subject contained in the image. The detection of the main subject by the image processing unit 30 can be performed using a known face detection function. The image processing unit 30 may be configured to detect, in addition to a face, a human body contained in the image as a main subject as disclosed in JP 2010-16621 A (US 2010/0002940).

The working memory 40 temporarily stores, for instance, image data before and after JPEG compression or image data before and after MPEG compression. The display unit 50, which includes, for instance, a liquid crystal display panel 51, displays images (still images or movie images) captured by the imaging unit 20 and various types of information or displays an input operation screen. The display 50 has an arrangement that includes a liquid crystal display panel 51 and a touch panel 52 stacked on a display surface of the liquid crystal display panel 51. The touch panel 52 outputs a signal that indicates the position of the liquid crystal display panel 51 at which the user touches.

The storage unit 60 stores various types of data such as image data at a storage medium such as a memory card. The control unit 70, which has a CPU, controls operations in whole of the imaging device 1. In the present embodiment, the control unit 70 divides the imaging area of the image sensor 100 (imaging chip 113) into a plurality of blocks and causes different blocks to capture images at different frame rates and gains. To achieve this, the control unit 70 sends instructions with respect to the position, shape, and range of the blocks and respective control parameters for the blocks to the drive unit 21.

The control unit 70 causes the AF operation unit 71 to calculate a focus adjustment state achieved by the imaging optical system 10. The control unit 70 further causes the AE, AWB operation unit 72 to perform exposure calculation to enable proper exposure to be obtained.

<AF Region and AE Region>

Figure 6:
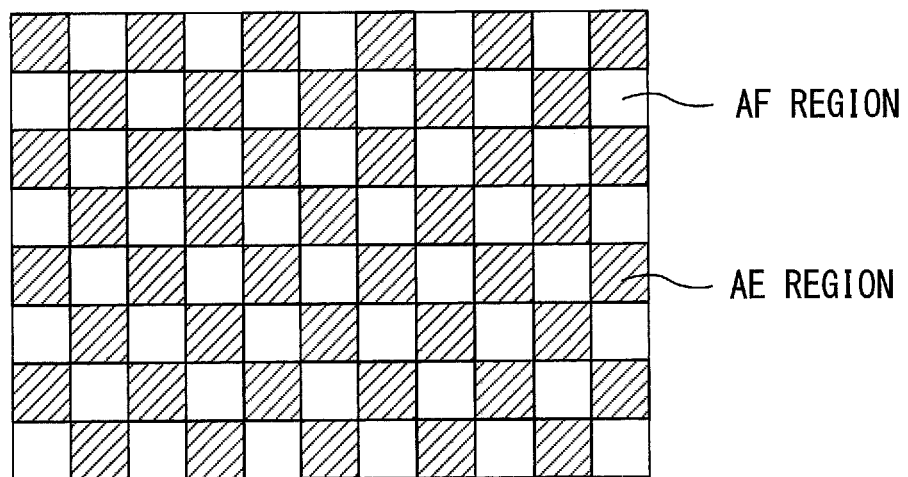
FIG. 6 is a diagram illustrating an example of the arrangement of AF regions and AE regions of the image sensor.

In the first embodiment, concepts of AF region and AE region in the screen are introduced and are related to the plurality of blocks mentioned above. FIG. 6 is a diagram showing an example of the arrangement of AF regions and AE regions at the image sensor 100 (imaging chip 113). In FIG. 6, shaded portions indicate AE regions and non-shaded portions indicate AF regions. In the first embodiment, it is set in advance so that the AF regions and the AE regions are arranged in a checkerboard pattern. The control unit 70, for instance, upon capturing a live view image, performs focus detection processing at the AF operation unit 71 using signals output from the AF regions of the image sensor 100.

The live view image, which is called also a preview image before main imaging is performed, refers to an image for monitoring acquired by the image sensor 100 at a predetermined frame rate (for instance, 30 fps). The focus detection processing is performed by, for instance, a contrast detection method. Specifically, while the position of the focus lens is being moved, the position of the focus lens of the imaging optical system 10 is adjusted so as to increase the contrast of the image constituted by signals output from the AF regions.

The focus detection processing may be performed by a phase difference detection method. In this case, pixels for focus detection are arranged in the AF regions of the image sensor 100 (imaging chip 113). Then, phase difference detection calculation is performed using the signals output from the pixels for focus detection to detect a focus adjustment state (specifically, a defocus amount) by the imaging optical system 10. The focus detection pixels and the phase difference detection calculation are known as disclosed in JP 2009-94881 A, and their detailed explanations are omitted.

The control unit 70 performs exposure operation processing at the AE, AWB operation unit 72 using the signals output from the AE regions upon capturing the live view image. The AE, AWB operation unit 72 determines exposure (frame rate, gain, etc.) so that an average level of signals output from, for instance, the AE regions can become closer to a predetermined level. The control unit 70 also determines a white balance adjustment value based on the signals output from the AE regions. The control unit 70 creates an image for monitoring based on the signals output from the AE regions and causes the created image to be brought up on display as the live view image at the display unit 50.

The control unit 70, upon capturing a live view image, sends an instruction to the drive unit 21, causing the image sensor 100 (imaging chip 113) to be divided into the AF regions and the AE regions for controlling charge accumulation. In the first embodiment, the control of charge accumulation for the AF regions and the AE regions dividedly is performed before main imaging (still image storage and movie storage) is instructed via a release switch (not shown).

That is, until main imaging is instructed, different control parameters are applied to the AF regions and the AE regions to obtain different images. Then, focus detection processing is performed based on the image obtained from the AF regions and exposure calculation, white balance calculation, and display of live view image are performed based on the image obtained from the AE regions.

Regarding to the control parameters used for processing for the AF regions before main imaging, the frame rate is set, for instance, 120 fps and the gain is set higher than the gain for the AE regions. Regarding the control parameters used for processing for the AE regions before main imaging, the frame rate is set at, for instance, 30 fps, which is lower than the frame rate for the AF regions and the gain is set lower than the gain for the AF regions. In this manner, applying a frame rate, which is higher than the frame rate applied to the AE regions, to the AF regions to obtain an image used for focus detection processing enables responsiveness of focus detection processing to be increased. Application to the AE regions of gain lower than the gain applied to the AF regions to obtain images used for exposure calculation processing and for determination of white balance adjustment values enables high precision calculation avoiding the influences of noises.

Figure 7:
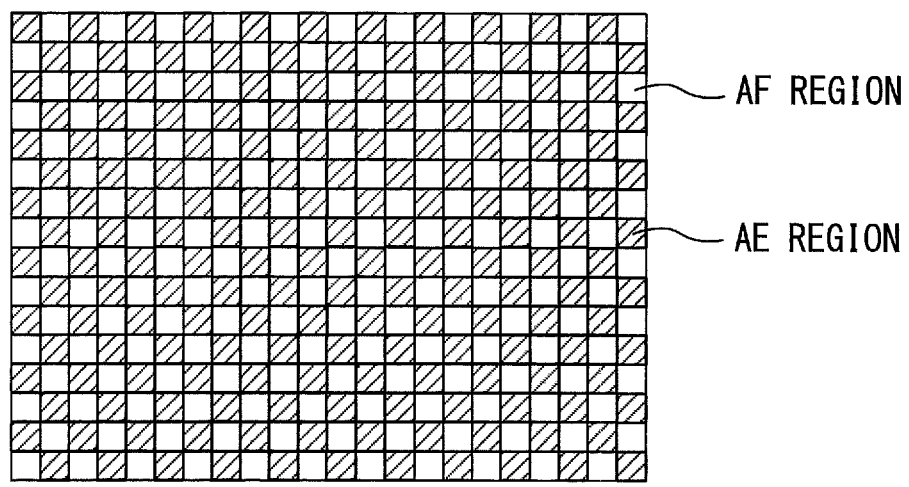
FIG. 7 is a diagram illustrating an example of the arrangement of AF regions and AE regions of the image sensor.

The arrangement of the AF regions and the AE regions at the image sensor 100 (imaging chip 113) is not limited to the one shown in FIG. 6 as an example and the individual sizes of the AF regions and the AE regions may be changed as appropriate. The individual sizes of the AF regions and the AE regions may be smaller as shown in FIG. 7 than those shown in FIG. 6 or larger than those shown in FIG. 6.

Figure 8:
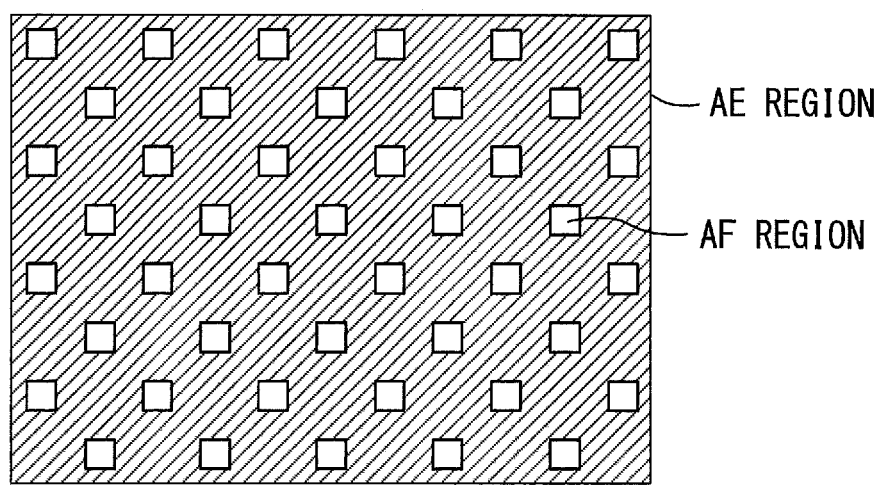
FIG. 8 is a diagram illustrating an example of the arrangement of AF regions and AE regions of the image sensor.

Not only the sizes of the AF regions and the AE regions but also the area ratio of the AF regions to the AE regions may be changed as appropriate as shown in FIG. 8. FIG. 8 is a diagram illustrating an example of the case in which the area of the AF regions is made larger than the area of the AE regions and the area ratio of the AF regions to the AE regions is changed to some extent. The live view image mentioned above is created by subsampling or culling a portion of the pixels of the image sensor 100 and consequently, for instance, setting the AF regions in correspondence to the subsampled or culled pixels and setting the AE regions in correspondence to the pixels for live view image avoids deterioration of the image quality of the live view image. In case that it is desired to arrange the AF regions only at a predetermined position such as the central part of the screen, the AF regions may be set at predetermined size and arranged only at predetermined position of the screen.

<Explanation on Flowchart>

Figure 9:
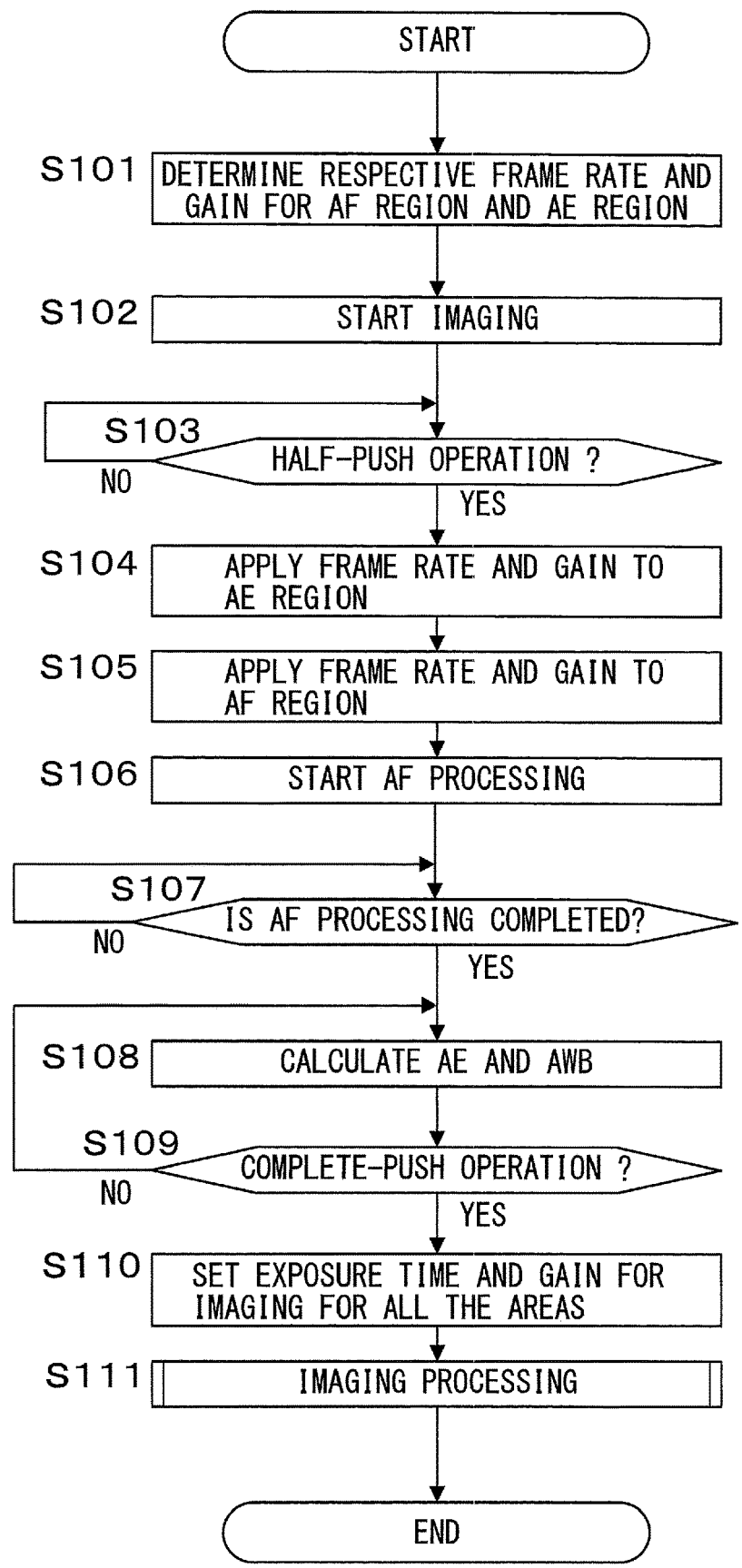
FIG. 9 is a flowchart illustrating the flow of imaging operation performed by a control unit according to a first embodiment.

FIG. 9 is a flowchart illustrating the flow of imaging operation that the control unit 70 of the imaging device 1 executes in the first embodiment. The control unit 70 starts up the processing illustrated in FIG. 9 repeatedly if an ON-OFF switch (not shown) is turned on and current is applied to each unit of the imaging device 1. In step S101 in FIG. 9, the control unit 70 determines control parameters for the AF regions and the AE regions, such as frame rate and gain and causes the operation to proceed to step S102. For instance, values applied in steps S102, S104, and S105 described later are provided by reading out them from the program data.

In step S102, the control unit 70 sends an instruction to the drive unit 21 to cause the imaging unit 20 to start imaging. The acquisition of image started in step S102 is performed by selecting, for instance, substantially the whole imaging area as the AE regions and setting control parameter for the AE regions. The control unit 70 causes the live view image data based on the signals output from the imaging unit 20 to be subjected to image processing by the image processing unit 30 and then causes the processed image data to be brought up on display at the display unit 50.

In step S103, the control unit 70 determines whether a release half-push operation is done. The release half-push operation is used as an instruction to the imaging device 1 to start pretreatment before main imaging (preparation for photographing). If the release button (not shown) is half-pushed, the control unit 70 makes a positive decision in step S103 and causes the operation to proceed to step S104. If no half-push operation is done, the control unit 70 makes a negative decision in step S103 and causes the decision operation to be repeated. To repeat the decision processing, it is awaited that a release half-push operation is done.

If the imaging device 1 is provided with no release button and instead is configured to determine a main imaging instruction based on whether any tap operation to a release icon that is brought up on display at the liquid crystal display panel 51 is detected, the processing in step S103 may be omitted. In this case, the control unit 70 causes power to turn on to start up the processing illustrated in FIG. 9 and then the processing from the start up of the imaging in step S102 to the processing in steps S104 and S105 described later to be performed to apply different control parameters (frame rate and gain) to the AF regions and the AE regions that are determined in advance as shown in FIG. 6. Also in case the imaging device 1 is provided with a movie switch that instructs the start and end of imaging a movie, the control unit 70 may be configured to cause processing similar to the tap operation to release icon to be performed or may cause pretreatment before main imaging (preparation of imaging) to be performed within several seconds after the movie switch is turned on.

In step S104, the control unit 70 sends an instruction to the drive unit 21 to cause it to apply control parameters such as frame rate and gain for the AF regions to the AF regions of the image sensor 100. In step S105, the control unit 70 sends an instruction to the drive unit 21 to cause it to apply control parameters such as frame rate and gain for the AE regions to the AE regions of the image sensor 100. Subsequently, the control unit 70 causes, based on signals output from the AE regions at the above-mentioned frame rate, minute adjustment of the control parameters, determination of white balance adjustment value, and bringing up on display of the live view image to be performed.

In step S106, the control unit 70 starts up the AF processing. Specifically, the control unit 70 causes the AF operation unit 71 to start focus detection processing based on the signals output from the AF regions and causes the operation to proceed to step S107. This enables focus adjustment of the imaging optical system 10 based on the signals output from the AF regions at the above-mentioned frame rate.

In step S107, the control unit 70 makes a decision whether the AF processing is completed. The control unit 70 makes a positive decision in step S107 if, for instance, the contrast of the image obtained from the AF regions is equal to or higher than a predetermined value whereas it makes a negative decision in step S107 if the contrast of the image obtained from the AF regions is below the predetermined value. In case it makes a negative decision, it causes the decision making processing to be repeated while it causes the focus detection processing to be continued.

In step S108, the control unit 70, based on signals output from the AE regions after the focus adjustment, causes the AE, AWB operation unit 72 to calculate exposure conditions and white balance adjustment value to be applied at the time of imaging and causes the operation to proceed to step S109.

In step S109, the control unit 70 makes a decision whether a release complete-push operation is performed. The release complete-push operation is used as an instruction for main imaging to the imaging device 1. The control unit 70 makes a positive decision in step S109 if the release button (not shown) is subjected to a complete-push operation and causes the operation to proceed to step S110 and makes a negative decision in S109 if the release button is not subjected to a complete-push operation and causes the operation to return to step S108. If the operation returns to step S108, the above-mentioned processing is repeated. The control unit 70 cancels the imaging by the imaging unit 20 using the control parameters for the AF regions and the control parameters for the AE regions if the release button (not shown) is subjected to a complete-push operation.

In case whether main imaging is instructed is determined by detecting any tap operation to the release icon that is brought up on display at the liquid crystal display panel 51 as mentioned above, a positive decision in step S109 is made when a tap operation is made to the release icon that is brought up on display.

In step S110, the control unit 70 sends an instruction to the drive unit 21 to cause control parameters (exposure time, gain, etc.) necessary for exposure conditions for imaging calculated in step S108 to be set and causes the operation to proceed to step S111.

In step S111, the control unit 70 executes imaging processing and causes the storage unit 60 to store data of the acquired image at, for instance, a memory card and causes the processing illustrated in FIG. 9 to end. In the imaging processing, one frame of still image is acquired (main imaging) by applying control parameters for imaging that are set common (same) for all the regions at the image sensor 100 and the acquired image is stored. In addition, after the still image is acquired, a plurality of frames of image is acquired. The control unit 70 may be configured to change, if a portion of the field contains a high brightness subject, imaging conditions of pixels corresponding to the high brightness subject. Then, based on a plurality of images acquired during predetermined times before and after the release complete-push operation, slow motion reproduction movie data is created and stored. The slow motion reproduction movie data means movie data reproduced at a frame rate (for instance, 15 fps), which is slower than the frame rate at which the image is acquired (for instance, 30 fps) by the image sensor 100.

The control unit 70 creates slow motion reproduction movie data as follows. That is, slow motion reproduction movie data is created based on a plurality of frame images based on the AE regions temporarily stored at the working memory for displaying the live view image from a time by a first predetermined time (for instance, 0.6 seconds) earlier than time of release complete-push operation (say, t1) to time t1 (the frame rate being the frame rate set for the AE regions, with frames acquired at 30 fps for 0.6 seconds giving 18 frames) and a plurality of frame images stored at the working memory 40 from time t1 to a time by a second predetermined time (for instance, 0.4 seconds) later than time t1 (with the frame rate being the same as the frame rate set for the AE regions prior to the instruction for main imaging, with frames acquired at 30 fps for 0.4 seconds giving 12 frames). In this manner, slow motion reproduction movie data, reproduction of which takes about 2 seconds, is created based on a plurality of frame images (total 30 frames) stored at the working memory 40 for 1 second sandwiching the time t1 (i.e., from a time 0.6 seconds before time t1 to a time 0.4 seconds after time t1). Thus, slow motion reproduction movie data is obtained based on the respective frame images acquired before and after the release complete-push operation. The slow motion movie data is created by the image processing unit 30 as MPEG data or JPEG data.

According to the above-mentioned embodiment, the following operations and advantageous effects are obtained.

(1) The imaging device 1 is capable of obtaining signals for use in exposure calculation processing and signals for use in detecting a focus adjustment state which are at appropriate levels, respectively. This enables performing exposure calculation and focus adjustment quickly with high precision. As a result, a user-friendly electronic apparatus can be achieved.

(2) The control unit 70 in response to the complete-push of the release switch (not shown) cancels the imaging by the imaging unit 20 using the control parameters for the AF regions and the control parameters for the AE regions and drives the imaging unit 20 under imaging conditions suitable for main imaging. This enables better still image and movie to be obtained.

(3) The control unit 70 acquires signals used for focus detection processing by applying to the second region a frame rate higher than the frame rate applied to the first region to increase responsiveness of the focus detection processing.

(4) The control unit 70 performs exposure calculation processing with setting gain for the first region lower than the gain for the second region. This enables high precision calculation with reduced influence of noises.

(5) If the control unit 70 determines the first region and the second region in advance, it may be configured to determine exposure based on a fixed position in the screen as a reference or perform focus adjustment based on a fixed position at the screen as a reference.

Second Embodiment

In the above-mentioned first embodiment, explanation is made on the example in which the arrangements of the AF regions and the AE regions at the image sensor 100 (imaging chip 113) are determined in advance. In contrast, in a second embodiment the arrangements of the AF regions and the AE regions at the image sensor 100 (imaging chip 113) are determined through scene recognition based on the live view image. The arrangement of the imaging device 1 is similar to that of the one shown in FIG. 5 in the first embodiment and explanation of the arrangement of the imaging device 1 is omitted.

Figure 10:
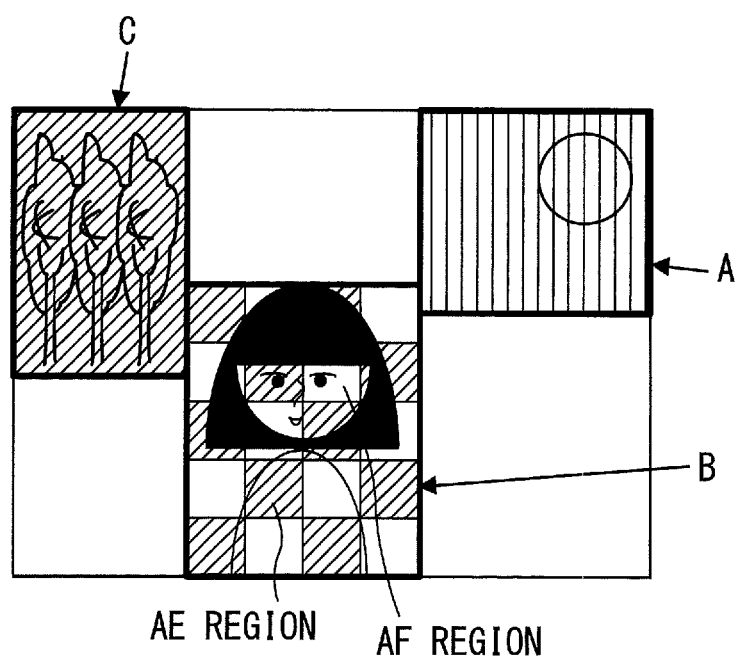
FIG. 10 is a diagram illustrating the relationship between AF regions and AE regions and a live view image.

FIG. 10 is a diagram illustrating the relationship between the AF regions and AE regions and the live view image according to the second embodiment. In FIG. 10, a person is contained short of the center of the live view image, trees are contained in the left upper part of the live view image, and in the right upper part of the live view image is contained the sun. The control unit 70 sends an instruction to the image processing unit 30 to cause the image processing unit 30 to perform known scene recognition processing to the live view image data. The image processing unit 30 performs scene recognition processing to extract a high brightness region A, a main subject region B, and a background region C from the live view image.

The image processing unit 30 determines, for instance, a range of the live view image data in which the signal level exceeds a predetermined high brightness threshold value to be a high brightness region A. The image processing unit 30 determines a range in which a human body detected as described above is contained to be a main subject region B. The image processing unit 30 may be configured to detect not only a person but also an animal such as a pet and determine a range in which the animal is contained to be the main subject region B. The image processing unit 30 is further configured to perform edge detection at a position excluding the high brightness region A and the main subject region B and determine a range in which the density of the detected edge exceeds a predetermined value to be a background region C. If no live view image data has a value that exceeds the high brightness threshold value, the image processing unit 30 determines that no high brightness region A is present.

The control unit 70 causes the AF regions and the AE regions in the main subject region B to be arranged in a checkerboard pattern. In FIG. 10, the shaded part in the main subject region B represents the AE regions and non-shaded part represents the AF regions. The arrangement of the AF regions and the AE regions in the main subject region B is not limited to the one shown in FIG. 10 as an example. The sizes of the AF regions and the AE regions may be individually changed as appropriate. Not only may the sizes of the AF regions and the AE regions but also the area ratio be changed such that the area of the AE regions is larger than the area of the AF regions. If it is desired to arrange the AF regions only at a predetermined position such as in the central part of the main subject region B, the AF regions with a predetermined size may be arranged only at the predetermined position. The control unit 70 may be configured to cause the AF regions and the AE regions to be arranged such that portions of the AF regions and the AE regions protrude outside the main subject region B.

The control unit 70 determines the background region C to be an AE region. In FIG. 10, the shaded part in the background region C represents an AE region. The control unit 70 determines neither AF regions nor AE regions for portions having a threshold value that exceeds the high brightness threshold value (high brightness region A in the example shown in FIG. 10). In FIG. 10, the portion with vertical lines in the high brightness region represents neither AF region nor AE region.

The control unit 70 according to the second embodiment is configured to determine region other than the regions A, B and C of the live view image screen (blank portion in FIG. 10) to be AE regions.

According to the second embodiment, three settings are made on the image sensor 100 (imaging chip 113) upon capturing a live view image. FIG. 11 is a diagram illustrating the three settings. Setting 1 is to set control parameters (frame rate, gain, etc.) suitable for high brightness for high brightness region A (that is, neither AF area nor AE region) so as to avoid saturation of output signal by, for instance, increasing frame rate and decreasing gain.

Setting 2 is to control parameters (frame rate, gain, etc.) suitable for focus detection processing for the AF regions at the main subject region B in the same manner as that in the first embodiment and to set control parameters (frame rate, gain, etc.) suitable for exposure calculation processing for the AE regions at the main subject region B in the same manner as that in the first embodiment.

Setting 3 is to set control parameters (frame rate, gain, etc.) suitable for exposure calculation processing for the background region C and the region that belongs neither to the high brightness region A nor the main subject region B (blank portion in FIG. 10) in the same manner as that in the AE regions in the main subject region B.

The control unit 70 sends an instruction to the drive unit 21 to cause the above three settings to be made on the image sensor 100 (imaging chip 113). This allows the image sensor 100 (imaging chip 113) to be controlled for charge accumulation with different control parameters (frame rate, gain, etc.) for the AF regions, AE regions and the region other than the AF regions and the AE regions upon capturing the live view image. Control of charge accumulation is performed, for instance, from a time after the scene recognition by the image processing unit 30 to a time in which main imaging is instructed.

That is, before the main imaging is instructed, different control parameters are applied to the AF regions, the AE regions, and the region other than the AF regions and the AE regions to obtain different images. Then, focus detection processing is performed based on the image acquired from the AF regions, exposure calculation and white balance calculation are performed based on the image acquired from the AE regions, and display of live view image is performed based on the image acquired from the AE regions and the region other than the AF regions and the AE regions.

The control parameters for the AF regions include, for instance, a frame rate of 120 fps and gain that is higher in the AE regions than the AF regions. The control parameters for the AE regions include, for instance, a frame rate of 30 fps, which is lower than the frame rate for the AF regions, and a gain of the AE regions being lower than the gain of the AF regions. Applying to the AF regions a frame rate higher than the frame rate applied to the AE regions to acquire images for focus detection processing is intended to improve the responsiveness of the focus detection processing. To capture images for use in exposure calculation processing and in determination of white balance adjustment value by applying to the AE regions a gain lower than that applied to the AF regions is intended to perform high precision calculation avoiding the influence of noises.

The control parameters for the region other than the AF regions and the AE regions include, for instance, a frame rate of 60 fps and a gain lower than that applied to the AE regions. This enables image of high brightness subject that would cause clipped whites to be captured without causing any clipped whites.

<Explanation on Flowchart>

Figure 12:
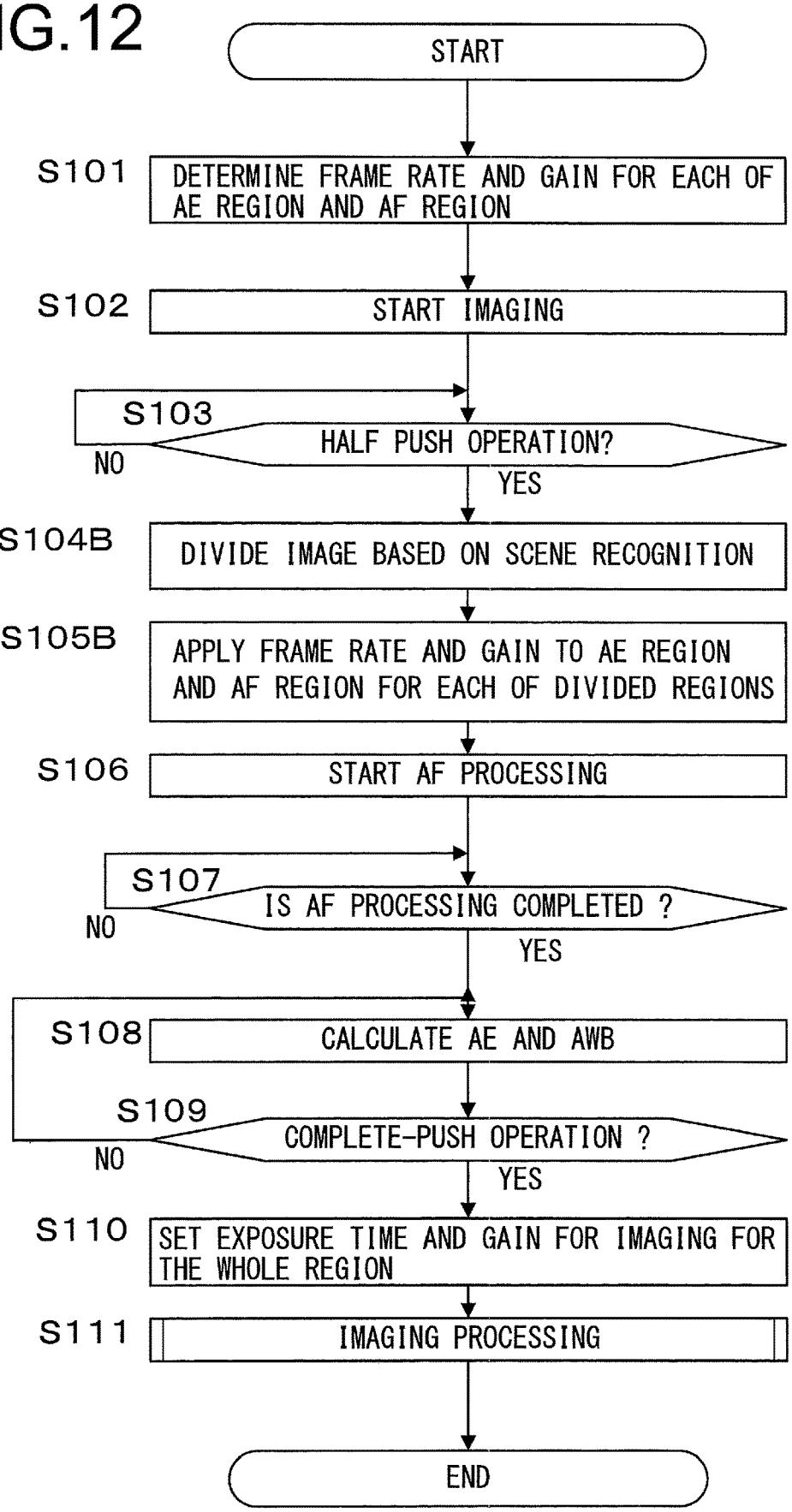
FIG. 12 is a flowchart illustrating the flow of imaging operation performed by the control unit according to the second embodiment.

FIG. 12 is a flowchart illustrating the flow of imaging processing executed by the control unit 70 of the imaging device 1 according to the second embodiment. The flowchart relating to the second embodiment differs from the flowchart relating to the first embodiment illustrated in FIG. 9 in the processing in steps S104B and S105B. Explanation is focused on these differences.

Capturing of image started in step S102 in FIG. 12 is performed by determining substantially the whole area of the imaging plane to be AE regions and setting control parameters for the AE regions in the same manner as that in the case shown in FIG. 9. The control unit 70 determines the live view image data based on signals output from the imaging unit 20 by the above-mentioned settings to be a subject of scene recognition. In step S104B, the control unit 70 sends an instruction to the image processing unit 30 to cause it to perform known scene recognition processing on the live view image data. The image processing unit 30 performs the scene recognition processing to divide the screen into the high brightness region A, the main subject region B, and the background region C as described above.

In step S105B, the control unit 70 sends an instruction to the drive unit 21 to cause the above-mentioned three settings to be performed for each divided region. This allows applying different control parameters to the AF regions, the AE regions, the region other than the AF regions and the AE regions to obtain different images. The control unit 70 is capable of performing minute adjustment of control parameters and determining a white balance adjustment value based on the images acquired from the AE regions. The live view image may be displayed based on the images acquired at the AE regions and the region other than the AF regions and the AE regions.

According to the second embodiment as explained above, the following operations and advantageous effects can be obtained.

(1) The imaging device 1 is capable of changing the position which is a target of exposure calculation and the position which is a target of focus adjustment based on the result of the scene analysis.

(2) The control unit 70 is configured to set a first region and a second region within the range of the above-mentioned image that is determined by the image processing unit 30 to contain the main subject. This enables determination of exposure for the main subject within the screen and focus adjustment taking the main subject as a target.

(3) The control unit 70 is configured to set the first region outside the range of the image that is determined by the image processing unit 30 to contain the main subject. This enables the background other than the main subject to be contained as a target of exposure calculation.

(4) The control unit 70 is configured to set the first region and the second region outside the range of the above-mentioned image that is determined by the image processing unit 30 to have brightness exceeding the predetermined value. This enables, for instance, any saturated signals from the imaging unit 20 to be removed from the target of exposure calculation and focus detection.

Variation Example 1

The imaging device 1 according to the first embodiment or the second embodiment may be constituted by a high functionality mobile phone or a tablet terminal. In this case, the camera unit installed at the high functionality mobile phone (or tablet terminal) is constituted with the stacked image sensor 100 mentioned above.

Variation Example 2

In the above explanation, explanation is made on the example in which minute adjustment of the control parameters and determination of white balance adjustment value are performed based on the images acquired from the AE regions. Instead, an AWB region may be provided separately from the AF regions and the AE regions. Then, upon acquiring the live view image the image sensor 100 (imaging chip 113) is controlled for its accumulation of charge with different control parameters (frame rate, gain, etc.) for the AF regions, the AE regions, and the AWB region separately.

In the variation example 2, the control unit 70 causes focus detection processing to be performed based on the images acquired from the AF regions. The control unit 70 causes determination of white balance adjustment value based on the image acquired from the AWB region. Minute adjustment of the control parameters is performed based on the images acquired from the AE regions. Display of the live view image is performed based on the image acquired from the AE regions and the image acquired from the region other than the AF regions and the AE regions.

Various embodiments and variation examples have been explained. However, the present invention is not limited to these contents. The configuration of each embodiment and that of each variation example may be combined with each other. Other aspects conceivable within the technical concept of the present invention are also included in the scope of the present invention. The order of each processing in the flowchart may be changed.

REFERENCE SIGNS LIST

1 . . . imaging device
10 . . . imaging optical system
20 . . . imaging unit
30 . . . image processing unit
40 . . . working memory
50 . . . display unit
51 . . . liquid crystal display panel
52 . . . touch panel
60 . . . storage unit
70 . . . control unit
71 . . . AF operation unit
72 . . . AE, AWB operation unit
100 . . . image sensor
109 . . . bump
111 . . . signal processing chip
112 . . . memory chip
113 . . . imaging chip
131 . . . unit region The disclosure of the following priority application is herein incorporated by reference:

Japanese Patent Application No. 2013-037617 (filed on Feb. 27, 2013).

The invention claimed is:

1. An image sensor in which a plurality of semiconductor substrates are stacked, the plurality of semiconductor substrates comprising:
   a first semiconductor substrate that includes a plurality of pixels arranged in a row direction and a column direction; and
   a second semiconductor substrate that includes (i) a first conversion unit that converts a first signal, read from a first pixel among the plurality of pixels to a first output wiring, into a digital signal, (ii) a second conversion unit that converts a second signal, read from a second pixel on a column direction side from the first pixel among the plurality of pixels to a second output wiring, into a digital signal, (iii) a first current source that supplies a current to the first pixel, and (iv) a second current source that supplies a current to the second pixel, wherein:
   the first current source is connected to the first output wiring;
   the second current source is connected to the second output wiring;
   the first output wiring outputs a third signal, read from a third pixel on a row direction side from the first pixel among the plurality of pixels; and
   the second output wiring outputs a fourth signal, read from a fourth pixel on the row direction side from the second pixel among the plurality of pixels.

2. The image sensor of claim 1, wherein the plurality of semiconductor substrates further comprises
   a third semiconductor substrate that includes (i) a first storage unit that stores the first signal that has been converted to the digital signal by the first conversion unit and (ii) a second storage unit that stores the second signal that has been converted to the digital signal by the second conversion unit.

3. The image sensor of claim 1, wherein
the first conversion unit converts the third signal read from the third pixel into a digital signal, and
the second conversion unit converts the fourth signal read from the fourth pixel into a digital signal.

4. The image sensor of claim 3, wherein the plurality of semiconductor substrates further comprises
a third semiconductor substrate that includes (i) a first storage unit that stores the first signal that has been converted to the digital signal by the first conversion unit, (ii) a second storage unit that stores the second signal that has been converted to the digital signal by the second conversion unit, (iii) a third storage unit that stores the third signal that has been converted to the digital signal by the first conversion unit, and (iv) a fourth storage unit that stores the fourth signal that that has been converted to the digital signal by the second conversion unit.

5. The image sensor of claim 1, further comprising:
a first control wiring to which is output a first control signal for controlling the first pixel and the third pixel; and
a second control wiring to which is output a second control signal for controlling the second pixel and the fourth pixel.

6. The image sensor of claim 5, wherein:
the first pixel includes (i) a first photoelectric conversion unit that converts light to an electric charge and (ii) a first transfer unit that is connected to the first control wiring and transfers the charge converted by the first photoelectric conversion unit;
the second pixel includes (i) a second photoelectric conversion unit that converts light to an electric charge and (ii) a second transfer unit that is connected to the second control wiring and transfers the charge converted by the second photoelectric conversion unit;
the third pixel includes (i) a third photoelectric conversion unit that converts light to an electric charge and (ii) a third transfer unit that is connected to the first control wiring and transfers the charge converted by the third photoelectric conversion unit; and
the fourth pixel includes (i) a fourth photoelectric conversion unit that converts light to an electric charge and (ii) a fourth transfer unit that is connected to the second control wiring and transfers the charge converted by the fourth photoelectric conversion unit.

7. The image sensor of claim 6, further comprising:
a third control wiring to which is output a third control signal for controlling the first pixel and the third pixel; and
a fourth control wiring to which is output a fourth control signal for controlling the second pixel and the fourth pixel.

8. The image sensor of claim 7, wherein:
the first pixel includes (i) a first floating diffusion to which is transferred the electric charge converted by the first photoelectric conversion unit and (ii) a first reset unit that is connected to the third control wiring and resets a potential of the first floating diffusion;
the second pixel includes (i) a second floating diffusion to which is transferred the electric charge converted by the second photoelectric conversion unit and (ii) a second reset unit that is connected to the fourth control wiring and resets a potential of the second floating diffusion;
the third pixel includes (i) a third floating diffusion to which is transferred the electric charge converted by the third photoelectric conversion unit and (ii) a third reset unit that is connected to the third control wiring and resets a potential of the third floating diffusion; and
the fourth pixel includes (i) a fourth floating diffusion to which is transferred the electric charge converted by the fourth photoelectric conversion unit and (ii) a fourth reset unit that is connected to the fourth control wiring and resets a potential of the fourth floating diffusion.

9. The image sensor of claim 5, wherein:
the first pixel includes (i) a first floating diffusion to which is transferred the electric charge converted by the first photoelectric conversion unit and (ii) a first reset unit that is connected to the first control wiring and resets a potential of the first floating diffusion;
the second pixel includes (i) a second floating diffusion to which is transferred the electric charge converted by the second photoelectric conversion unit and (ii) a second reset unit that is connected to the second control wiring and resets a potential of the second floating diffusion;
the third pixel includes (i) a third floating diffusion to which is transferred the electric charge converted by the third photoelectric conversion unit and (ii) a third reset unit that is connected to the first control wiring and resets a potential of the third floating diffusion; and
the fourth pixel includes (i) a fourth floating diffusion to which is transferred the electric charge converted by the fourth photoelectric conversion unit and (ii) a fourth reset unit that is connected to the second control wiring and resets a potential of the fourth floating diffusion.

10. An imaging device provided with the image sensor of claim 1.

11. The imaging device of claim 10, further comprising a control unit that adjusts a position of a lens that causes light to be incident upon the image sensor, using either the first signal or the second signal output from the image sensor.

12. The imaging device of claim 10, further comprising a control unit that adjusts a position of a lens that causes light to be incident upon the image sensor, using the first signal, the second signal, the third signal or the fourth signal output from the image sensor.

13. An imaging device provided with the image sensor of claim 5.

14. The imaging device of claim 13, further comprising a control unit that adjusts a position of a lens that causes light to be incident upon the image sensor, using the first signal, the second signal, the third signal or the fourth signal output from the image sensor.

15. An imaging device provided with the image sensor of claim 7.

16. The imaging device of claim 15, further comprising a control unit that adjusts a position of a lens that causes light to be incident upon the image sensor, using the first signal, the second signal, the third signal or the fourth signal output from the image sensor.

17. The image sensor of claim 1, wherein
the third pixel is arranged next to the first pixel, and
the fourth pixel is arranged next to the second pixel.

18. The image sensor of claim 17, wherein
the first conversion unit converts the third signal read from the third pixel into a digital signal, and
the second conversion unit converts the fourth signal read from the fourth pixel into a digital signal.

19. The image sensor of claim 18, wherein the plurality of semiconductor substrates further comprises
a third semiconductor substrate that includes (i) a first storage unit that stores the first signal that has been converted to the digital signal by the first conversion unit, (ii) a second storage unit that stores the second signal that has been converted to the digital signal by the second conversion unit, (iii) a third storage unit that stores the third signal that has been converted to the digital signal by the first conversion unit, and (iv) a fourth storage unit that stores the fourth signal that that has been converted to the digital signal by the second conversion unit.

20. An imaging device provided with the image sensor of claim 17.

* * * * *